(12) United States Patent
Kirn

(10) Patent No.: US 6,538,505 B1
(45) Date of Patent: Mar. 25, 2003

(54) DISTORTION REDUCTION TECHNIQUE FOR INDUCTIVE BOOST AMPLIFIER

(75) Inventor: Larry Kirn, West Bloomfield, MI (US)

(73) Assignee: JAM Technologies, LLC, Boston, MA (US)

( * ) Notice: Subject to any disclaimer, the term of this patent is extended or adjusted under 35 U.S.C. 154(b) by 0 days.

(21) Appl. No.: 09/980,966

(22) PCT Filed: May 19, 2000

(86) PCT No.: PCT/US00/13934

§ 371 (c)(1),
(2), (4) Date: Nov. 15, 2001

(87) PCT Pub. No.: WO00/70754

PCT Pub. Date: Nov. 23, 2000

(51) Int. Cl.[7] .............................. H03F 3/38; H03F 21/00; H03F 3/217
(52) U.S. Cl. ....................... 330/10; 330/207 A; 330/251
(58) Field of Search ............................... 330/10, 207 A, 330/251

(56) References Cited

U.S. PATENT DOCUMENTS

| | | | | |
|---|---|---|---|---|
| 5,920,471 A | * | 7/1999 | Rajagopalan et al. | 323/288 |
| 6,181,114 B1 | * | 1/2001 | Hemena et al. | 323/222 |
| 6,275,018 B1 | * | 8/2001 | Telefus et al. | 323/222 |
| 6,370,039 B1 | * | 4/2002 | Telefus | 363/131 |

* cited by examiner

Primary Examiner—Patricia Nguyen
(74) Attorney, Agent, or Firm—Glifford, Krass, Groh, Sprinkle, Anderson & Citkowski, PC

(57) ABSTRACT

A distortion reduction technique finds particular utility in inductive boost amplifiers. In contrast to existing arrangements, the invention uses the boost voltage itself, rather than the output voltage(s), as feedback to linearize the output. As such, the boost voltage is not subject to the severe time delay of the output filter, yet is sensitive to the effects of back-EMP from inductive loads, which tend to exist at frequencies well below the cutoff frequency of the output filter. The invention is applicable to bridged and non-bridged configurations using analog and/or digital circuitry.

4 Claims, 1 Drawing Sheet

DISTORTION REDUCTION TECHNIQUE FOR INDUCTIVE BOOST AMPLIFIER

FIELD OF THE INVENTION

This invention relates generally to switching amplifiers and, in particular, to a distortion reduction technique for inductive boost amplifiers.

BACKGROUND OF THE INVENTION

Inductive boost amplifiers yield high efficiency and reasonably low distortion when driving essentially resistive loads. A representative example of such an amplifier is shown in U.S. Pat. No. 5,610,553 entitled "Switching Amplifier with Impedance Transformation Output Stage," the teachings of which are incorporated herein by reference.

When driving inductive loads, however, amplifiers of this type tend to produce excessive voltage due to their inability to detect back-EMF from the load. This leads to distortion during times of decreasing output voltage.

Use of negative feedback from the amplifier output gives moderate relief from this distortion, but is complicated by phase lags inherent to output filters required in switching amplifiers. Another feedback source is therefore desirable.

SUMMARY OF THE INVENTION

The present invention resides in a distortion reduction technique with particular applicability to inductive boost amplifiers. In contrast to existing arrangements, the invention uses the boost voltage itself, rather than the output voltage(s), as feedback to linearize the output. As such, the boost voltage is not subject to the severe time delay of the output filter, yet is sensitive to the effects of back-EMF from inductive loads, which tend to exist at frequencies well below the cutoff frequency of the output filter.

DETAILED DESCRIPTION OF THE INVENTION

Figure 1:
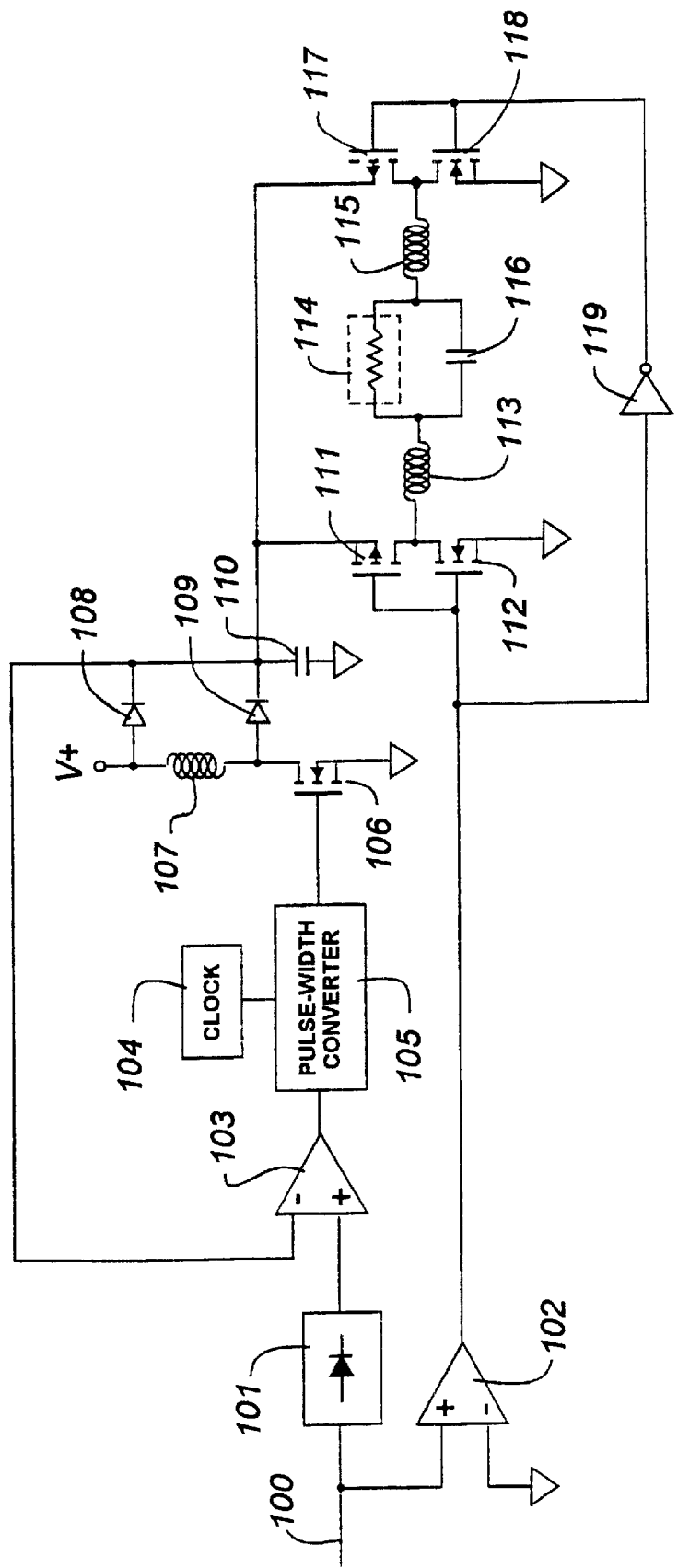
FIG. 1 is a schematic diagram illustrating a preferred embodiment of the invention.

FIG. 1 is a schematic diagram illustrating a preferred embodiment of the invention. Note that for cost savings and simplicity, a single boost converter is used in conjunction with switching devices in a bridged configuration to determine the polarity of the output. This circuit topology yields a single boosted voltage source, applicable to either polarity of the output. It will be appreciated that the invention is equally applicable to non-bridged configurations. In addition, although the technique is described in conjunction with analog circuitry, all-digital or semi-digital implementations will be readily apparent to those of skill in the art.

Incoming signal 100 is applied to a full-wave rectifier 101, which yields absolute value, and a comparator 102, which yields sign or polarity. The output of full-wave rectifier 101 is applied to the non-inverting input of error amplifier 103, which in turn drives pulse-width converter 105 triggered by clock source 104. The output of pulse-width converter 105 is a series of pulses of widths directly proportional to its input, and used to drive switching device 106.

Switching device 106 stores charge in inductor 107, which is released through diode 109 and filtered by capacitor 110. Diode 108 maintains a known voltage available during the charging period. The output of diodes 108 and 109 is available to switching devices 111 and 117. In the case of a positive input, switching device 117 is turned on and switching device 118 is turned off by inverter 119, being driven by comparator 102 mentioned previously.

Concurrently, switching device 111 is turned off and switching device 112 is turned on by comparator 102. In the case of a negative input, switching devices 111 and 118 are turned on and switching devices 112 and 117 are turned off by the same mechanism. The output of diodes 108 and 109 is therefore connected through either switching device 111 or 117 and inductor 113 or 115, respectively, to one terminal of the load 114, filtered by capacitor 116. The second terminal of load 114 is connected to V+ through either inductor 115 or 113 and switching device 118 or 112, respectively, to allow current flow.

The output of diode 109 is a voltage proportional to the pulse-width developed by pulse-width converter 105, summed with any back-EMF presented by the load 114. This voltage is presented to the inverting input of error amplifier 103. In that the noninverting input receives the desired voltage, any deviations in the boost voltage are reflected as signed corrective actions at the output of error amplifier 103, thereby nulling consequent distortion.

I claim:

1. An amplifier output stage with reduced distortion, comprising:

an input representative of a desired output signal;

a circuit for determining a deviation between the input and a feedback signal;

a pulse-width converter fully or partially controlled by the circuit;

a boost converter coupled to the output of the pulse-width converter for generating a boost voltage for application to a load through gated switches; and wherein the feedback signal is derived from the boost voltage.

2. The amplifier output stage of claim 1, wherein a single boost converter is used in a bridge configuration.

3. In an inductive boost amplifier wherein a boost voltage is coupled to a load through gated switches, the improvement comprising:

use of the boost voltage as feedback to linearize the output of the amplifier.

4. An amplifier output stage with reduced distortion, comprising:

an input feeding one side of two-input error amplifier;

a pulse-width converter coupled to the output of the error amplifier;

a boost converter coupled to the output of the pulse-width converter for generating a boost voltage for application to a load through gated switches; and wherein a signal representative of the boost voltage is delivered to the other input of the error amplifier.

* * * * *